United States Patent
De Steur et al.

(10) Patent No.: US 6,610,960 B2
(45) Date of Patent: Aug. 26, 2003

(54) METHOD FOR DRILLING MICRO-HOLES WITH A LASER BEAM

(75) Inventors: Hubert De Steur, Drongen (BE); Sébastian Edmé, Radinghem-Wennes (BE); Marcel Heerman, Merelbeke (BE); Eddy Roelants, Bruegge (BE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/079,895

(22) Filed: Feb. 22, 2002

(65) Prior Publication Data

US 2002/0190037 A1 Dec. 19, 2002

(30) Foreign Application Priority Data

May 23, 2001 (DE) .......................................... 101 25 397

(51) Int. Cl.[7] ............................................... B23K 26/00
(52) U.S. Cl. ................................................. 219/121.71
(58) Field of Search ....................... 219/121.71, 121.61, 219/121.69, 121.7, 121.72, 121.76, 121.77, 121.78, 122.85; 216/17, 65; 427/554, 555, 556, 96, 97; 264/400; 438/940

(56) References Cited

U.S. PATENT DOCUMENTS

| | | | |
|---|---|---|---|
| 5,108,785 A | * | 4/1992 | Lincoln et al. ............... 427/96 |
| 5,593,606 A | | 1/1997 | Owen et al. |
| 5,841,099 A | | 11/1998 | Owen et al. |
| 5,841,102 A | * | 11/1998 | Noddin .................. 219/121.71 |
| 5,868,950 A | * | 2/1999 | Noddin ....................... 216/18 |
| 6,130,015 A | * | 10/2000 | Noddin et al. ................. 430/22 |
| 6,391,210 B2 | * | 5/2002 | Appelt et al. .................. 216/13 |
| 6,407,363 B2 | * | 6/2002 | Dunsky et al. .......... 219/121.71 |

FOREIGN PATENT DOCUMENTS

| | | |
|---|---|---|
| DE | 4131065 | 3/1993 |
| DE | 19719700 | 11/1998 |
| EP | 0062300 | 10/1982 |
| WO | 00/04750 | 1/2000 |

* cited by examiner

*Primary Examiner*—Tom Dunn
*Assistant Examiner*—Jonathan Johnson

(57) ABSTRACT

To drill micro-holes in a multi-layer substrate having a first metal layer and at least one second metal layer, and having a dielectric layer arranged between two metal layers, use is made of a solid-state laser. The beam of the laser, in a first operation, ablates the first metal layer and, in a second operation, ablates the dielectric layer down to the second metal layer. In the first operation, the laser beam is set to a repetition frequency of at least 15 kHz, focused onto the first metal layer and moved in a circle corresponding to the diameter of the desired hole, in such a number of passes until this metal layer is cut through. Then, in the second operation, the laser beam is set to a preferably lower repetition frequency, directed out of focus onto the dielectric layer exposed in the hole and moved, with a circumferential velocity which is higher compared with the first operation, in one or more concentric circles, until the dielectric layer is ablated in the hole region. The effective energy density in the second operation is selected, by setting the defocusing and the circumferential velocity, in such a way that the effective energy density lies below the threshold for ablation of the second metal layer.

18 Claims, 4 Drawing Sheets

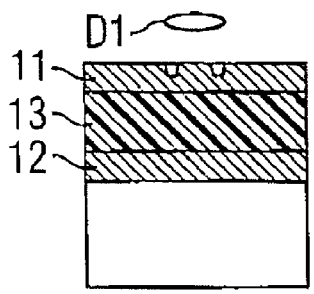
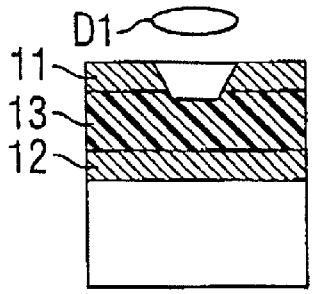
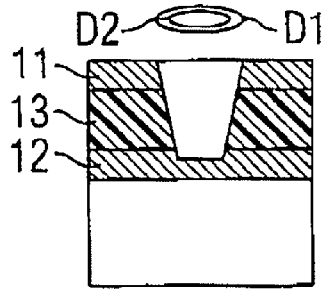
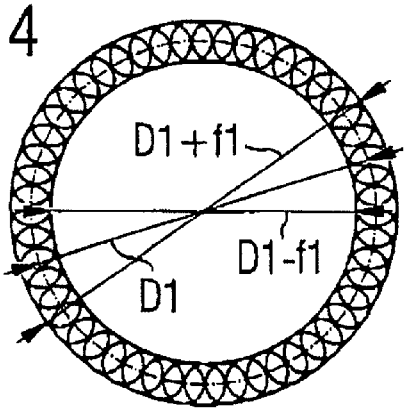
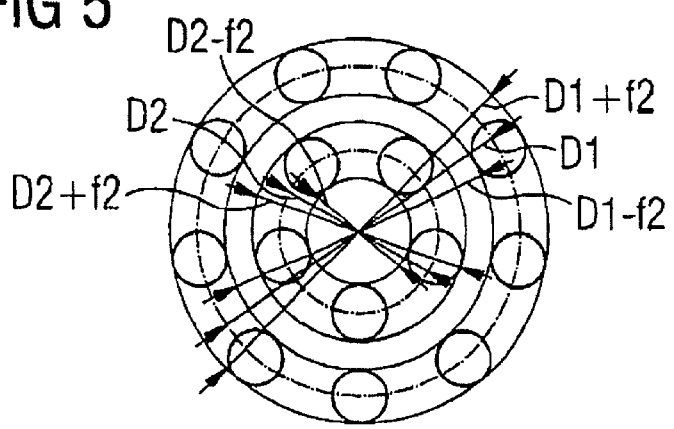

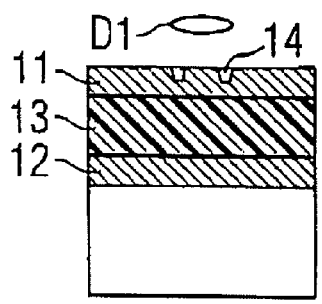
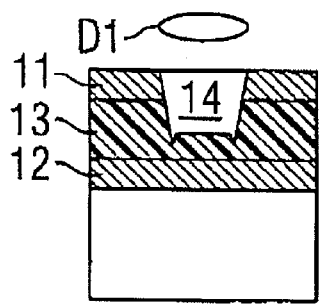
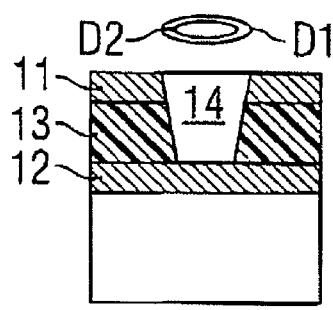
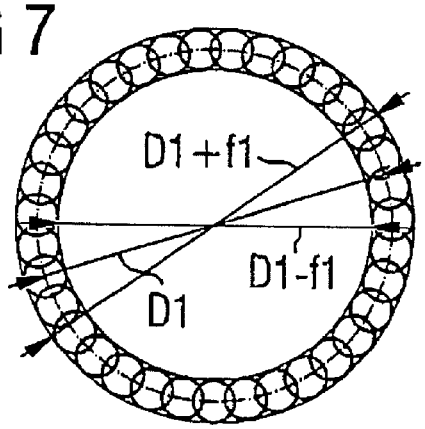
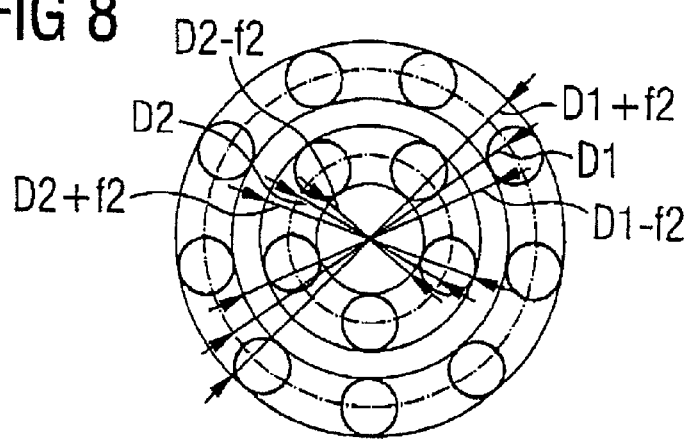

METHOD FOR DRILLING MICRO-HOLES WITH A LASER BEAM

This application claims priority under 35 U.S.C. §119 on German patent application 10125397.4 filed May 23, 2001, the entire contents of which are hereby incorporated herein by reference.

FIELD OF THE INVENTION

The invention generally relates to a method for drilling micro-holes. More preferably, it relates to drilling micro-holes in a multi-layer substrate having a first metal layer and at least one second metal layer, and having a dielectric layer in each case arranged between two metal layers. The drilling may be done, by irradiation with the energy beam of a solid-state laser, and may be carried out in two operations. In the first operation, the first metal layer and a part of the underlying dielectric layer may be in each case, ablated and, in the second operation, the dielectric layer is ablated cleanly down to the second metal layer.

BACKGROUND OF THE INVENTION

As electrical circuit substrates continue to be miniaturized, it is increasingly necessary to make both through-holes and blind holes having diameters of less than 200 μm, which can scarcely still be made with mechanical drills or punch needles. In this field, it has already been customary for a long time to produce micro-holes using laser drilling. However, this entails the problem that the different materials, i.e. conductor materials such as copper, on the one hand, and dielectrics, for example polymers with and without glass-fiber reinforcement, on the other hand, place very different demands on the laser processing.

For instance, it is well known which lasers in which wavelength range are optimally suitable for drilling in metals or for drilling in plastics. Problems arise, however, when multi-layer substrates need to be drilled through with one and the same laser, or need to be provided with blind holes to produce a conductive connection with a metallic interlayer. When such different material layers are being drilled, negative thermal effects can occur, for example detachment effects between metal layers and dielectric layers, damage to the dielectric itself or inadvertent drilling through a metal layer with which contact is intended to be made using a blind hole.

U.S. Pat. No. 5,593,606 A describes a method for drilling micro-holes in a multi-layer substrate, with which a UV laser with one and the same dimensioning is to be used for drilling completely through at least two layers having different properties. If the laser beam is dimensioned in such a way that it drills through a first metal layer and subsequently completely ablates a dielectric layer, however, this directly entails the risk that it will not come to a stop at the correct time on the second metal layer. Therefore, the second metal layer will also be attacked to a greater or lesser extent, unless the fact that the desired drilling depth has been reached is established by appropriate measuring instruments and the drilling process is terminated at the correct time.

In order to counteract this problem, U.S. Pat. No. 5,841,099 proposes a two-stage method (for drilling two layers), the laser being set to a higher energy density in a first operation for drilling a first metal layer, and the energy density of the laser being reduced, in the second operation for drilling a dielectric layer, to the extent that it falls below the threshold for metal vaporization. Because of its lower energy density, the laser can no longer drill through a second metal layer adjoining the dielectric layer. In order to set this lower energy density in the second operation, it is proposed therein to increase the repetition rate of the laser. However, optimum utilization of the laser energy and an optimum processing rate are not obtained in this way.

SUMMARY OF THE INVENTION

It is therefore an object of an embodiment of the present invention to refine the two-stage method, mentioned in the introduction, for drilling micro-holes using a laser. Preferably, this is done such that the micro-holes can be made with good quality and the highest possible processing rate, while optimally utilizing the laser power.

According to an embodiment of the invention, this object can be achieved by a method of drilling micro-holes in a multi-layer substrate having a first metal layer and at least one second metal layer, and having a dielectric layer in each case arranged between two metal layers. Drilling can be done by irradiation with the energy beam of a solid-state laser having a repetition frequency of at least 10 kHz, a wavelength of less than 1100 nm and a pulse length of less than 50 ns. The irradiation can be carried out in two operations in such a way that, in the first operation, the first metal layer and a part of the underlying dielectric layer are in each case ablated and, in the second operation, the dielectric layer is ablated cleanly down to the second metal layer.

In the first operation, the laser beam can be set to a repetition frequency of at least 15 kHz, focused onto the first metal layer and moved with a first circumferential velocity in a circle corresponding to the diameter of the desired hole. Movement can occur in such a number of passes until at least the first metal layer is cut through, the metal layer being fully removed in the hole region.

In the second operation, the laser beam can be set to an equal or lower repetition rate than in the first operation, directed out of focus onto the dielectric layer exposed in the hole and moved, with a circumferential velocity which is higher than the first, in one or more concentric circles inside the desired hole diameter. Movement can occur in such a number of passes until the dielectric layer is ablated in the hole region. The defocusing and/or the second velocity can be set in such a way that the effective energy density in the second operation lies below the threshold for ablation of the second metal layer.

In the method according to an embodiment of the invention, the repetition frequency is hence not increased, as in the prior art, to reduce the effective energy density when ablating the dielectric in the second operation. Rather, it is preferably lowered or at most kept at the same value as in the first operation. The effective energy density is instead reduced by defocusing, and hence by increasing the spot diameter on which the laser beam is incident, and furthermore by increasing the circumferential velocity, which shortens the action time of the individual laser pulses on a given area.

For drilling the hole in the metal layer (copper layer) in the first operation, it is generally sufficient for the laser to be moved repeatedly in a single circle, corresponding to the diameter of the desired hole, until the metal layer is circularly cut. For diameters up to 150 μm, the metal core that has been cut out can then detach automatically because of the heating effect, and pop out. For larger hole diameters, an additional pulse for heating may be delivered onto the metal core that has been cut free.

In order to achieve a clean hole edge, a high overlap (>50%) of the individual pulses that form the circle is sought in the first laser drilling operation. To that end, a higher repetition frequency of at least 15 kHz, preferably between 20 and 30 kHz, is selected for this first operation. Admittedly, available lasers no longer deliver the maximum average power in this range. Nevertheless, a neodymium vanadate laser (Nd:VO$_4$ laser) is preferably used, for which the power drop at higher repetition frequencies is still relatively minor. For instance, with a 355 nm Nd vanadate laser of 3.5 W having a focal spot diameter of 12 µm, it is possible to achieve a linear circumferential velocity of >175 mm/s. With lasers having a higher power, even higher velocities can be achieved by virtue of higher repetition frequencies. It is also correspondingly advantageous to use a neodymium vanadate laser having a wavelength of 532 nm.

In the second operation, the dielectric material may be ablated by guiding the laser in at least two concentric circles, in which case no overlap of the successive laser pulses is necessary. Here, the repetition frequency is selected approximately in such a way that the maximum available laser power is utilized for the material ablation. This maximum power is obtained, as is known, at a slightly lower repetition frequency, i.e. at about 10 to 20 kHz in the case of Nd:VO$_4$ lasers. In this case, the effective energy density can be matched, as mentioned, to a value below the vaporization threshold for metal by increasing the irradiated spot diameter, i.e. by defocusing or by altering the magnification factor of the collimator. In addition, the circumferential velocity is preferably increased in such a way that the individual pulses are no longer incident just on a spot corresponding to the beam diameter, but rather distribute their energy over a larger area owing to a blurring effect.

When using an Nd vanadate laser having a higher power, it is also conceivable not to make the laser beam move around a circle in the second operation, but rather to broaden the beam to the extent that it covers the entire hole area. In this case, the dielectric can be ablated with a central setting of the beam, with the hole cut out from the metal layer in the first operation being used as a mask.

BRIEF DESCRIPTION OF THE DRAWINGS

The invention will be explained in more detail below with reference to exemplary embodiments with the aid of the drawings, in which:

FIGS. 3A to 3C show a sectional representation of a substrate at various stages in the method when drilling a micro-hole in a first embodiment of a method according to an embodiment of the invention, FIG. 4 shows a schematic representation of the guiding of the laser beam in the first operation of a method according to an embodiment of the invention to make the hole according to FIGS. 3A and 3B, FIG. 5 shows a schematic representation of the guiding of the laser beam in the second operation of a method according to an embodiment of the invention to make the hole according to FIG. 3C, FIGS. 6A to 6C show a section through a substrate at various stages when making a micro-hole in another embodiment of a method according to an embodiment of the invention, FIG. 7 shows a schematic representation of the laser-beam guiding to make a micro-hole in a metal layer according to FIGS. 6A and 6B, FIG. 8 shows the schematic representation of the laser-beam guiding in a dielectric layer to make a micro-hole according to FIG. 6C.

DETAILED DESCRIPTION OF THE PREFERRED EMBODIMENTS

Figure 1:
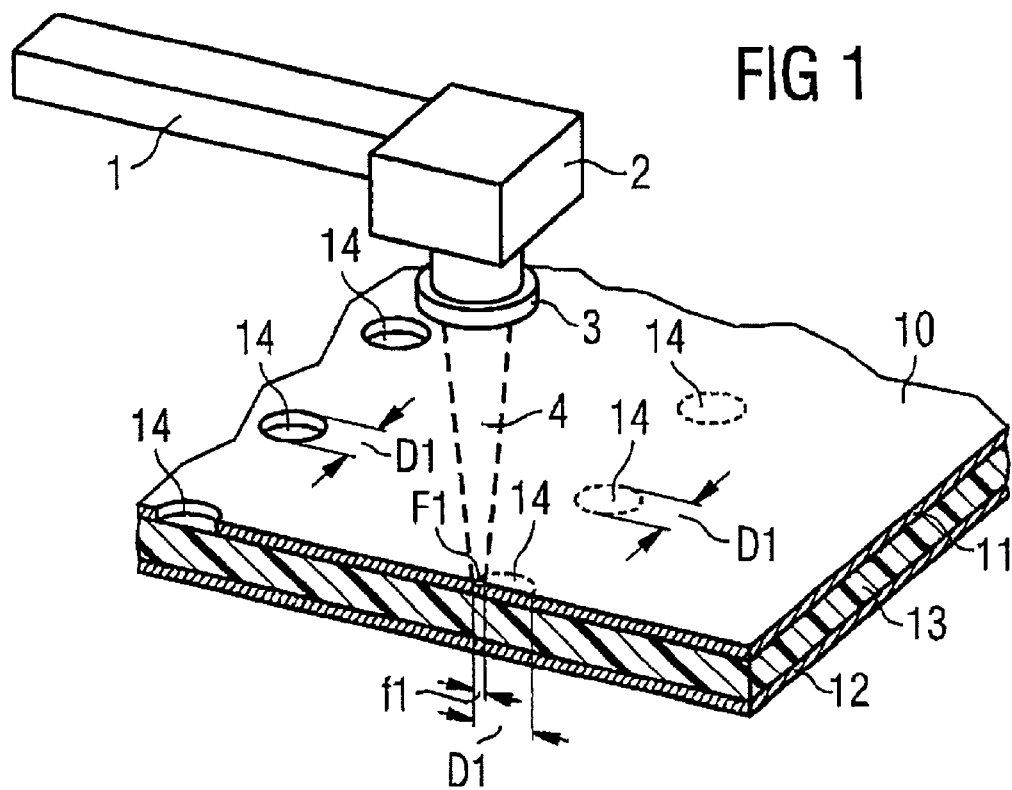
FIG. 1 shows a schematically shown laser arrangement with a setting for the first operation of a method according to an embodiment of the invention.
Figure 2:
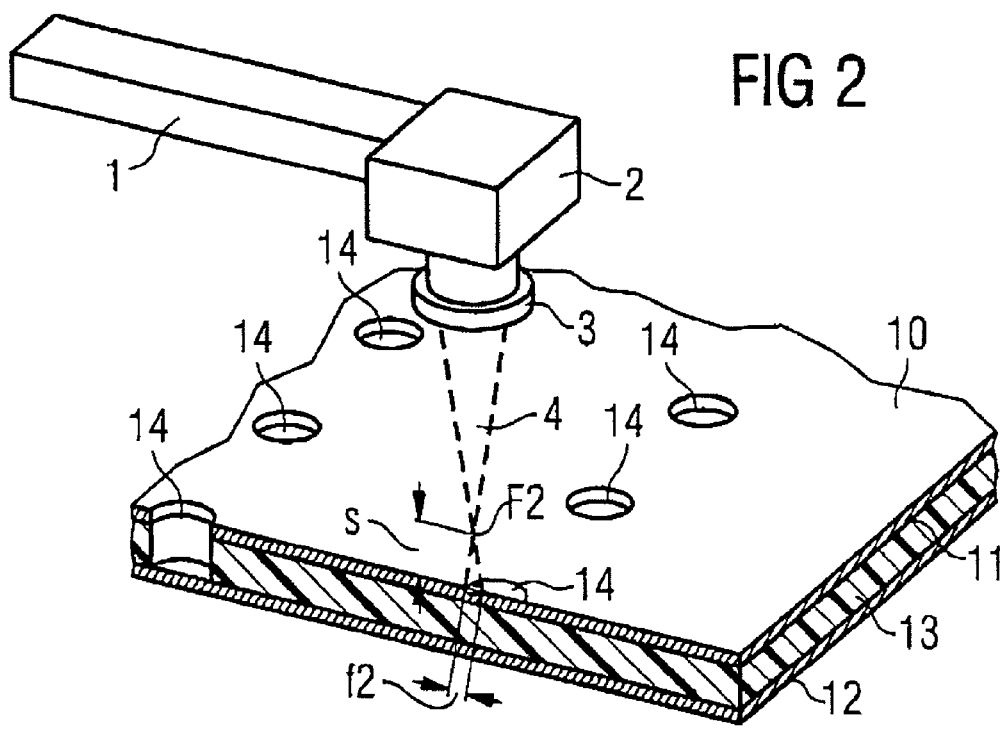
FIG. 2 shows the laser arrangement of FIG. 1 with a setting for the second operation of a method according to an embodiment of the invention.

The arrangement shown schematically, and by no means true to scale, in FIGS. 1 and 2 shows a laser 1 having a deflection unit 2 and an optical imaging unit 3, via which a laser beam 4 is directed onto a substrate 10. This substrate 10 has an upper, first metal layer (copper layer) 11 as well as a second metal layer 12, between which a dielectric layer 13 is arranged. This dielectric layer includes, for example, a polymer material such as RCC or a glass fiber-reinforced polymer material, such as FR4. While the metal layer, which generally includes copper, always requires the same amount of energy for processing or ablation (for an equal thickness and an equal volume), the amount of energy required for the dielectric depends greatly on the latter's composition. It should further be mentioned that the substrate 10 may also includes more than the three layers; further metal layers are in each case separated from one another by dielectric layers and may be selectively connected to one another and to the uppermost metal layer 11 by appropriate drilling.

In the present example, the task is to connect the first metal layer 11 to the second metal layer 12 by blind holes 14, without drilling through the layer 12. These holes 14 are intended, for example, to have a diameter of about 100 to 120 µm. They may, however, also be larger or smaller.

According to an embodiment of the invention, the holes are drilled in two operations. FIG. 1 shows the arrangement for the first operation, the laser beam 4 being focused onto a focal point F1 on the surface of the layer 11. The energy of the laser beam is in this case directed onto a spot having a diameter f1, in order to use the energy in as concentrated a way as possible for ablating the metal layer 11. In this case, the laser beam is moved in a circle having the diameter D1, as shown in FIG. 4. The circumferential velocity in this circle D1 is selected in such a way that the individual pulses overlap, for example, by more than 60%. In this way, a smooth edge is cut out of the metal layer. Depending on the thickness of the metal layer, a certain number of circuits will be necessary until it is fully cut through. FIGS. 3A and 3B show the chronological sequence of this operation 1 at various stages. The metal is cut out annularly according to FIG. 3A, until the metal layer is severed. The core that has been separated than pops out automatically because of the heating effect (at least for hole diameters<150 µm), which leads to the situation in FIG. 3B.

After the metal layer 11 has been drilled through, the laser is set according to FIG. 2 in such a way that the focal point F2 lies outside the hole region to be drilled, i.e. for example s=2 mm above the copper layer 12. In the region of the layer to be drilled, the laser beam is hence incident on a spot having the diameter f2. Furthermore, the repetition frequency is preferably reduced in order to utilize the maximum laser energy. The laser beam set in this way is then also moved in a circle, to be precise firstly again in a circle having the diameter D1, then in a concentric circle having the diameter D2. For normal hole diameters and material thicknesses, a few circuits are in this case sufficient to ablate the dielectric layer fully and cleanly in this way down to the second metal layer 12. Even if the circuits of the laser beam do not run over the entire hole area, the rest of the dielectric will nevertheless also be vaporized owing to the development of heat. Depending on the materials, material thicknesses and the desired hole diameter, it is naturally also possible to execute more concentric circles with the laser beam. The circumferential velocity will in this case be selected in such a way that the effective energy density lies below the threshold for the vaporization of the second metal layer 12. A blind hole 14 according to FIG. 3C is finally obtained.

As can be seen with the aid of FIGS. 1 and 2, the first operation is firstly performed for all the drillings 14, i.e. the metal layer is firstly drilled through for all the intended holes, so that the situation according to FIG. 3B is reached. The laser is then set to operation 2, and all the holes are completed by ablating the dielectric layer.

For the example represented in FIGS. 3A to 3C as well as 4 and 5, drillings were carried out using an Nd:VO$_4$ laser with a wavelength of 355 nm, specifically with a diameter of 110 μm. In this case, the procedure was carried out under the following conditions:

| Condition | Operation 1 | Operation 2 |
| --- | --- | --- |
| Material/thickness | Cu/12 μm | RCC/65–70, μm |
| Number of circle diameters | 1 | 2 |
| Circuits | 4 | 2 |
| Circumferential velocity | 200 mm/s | 400 mm/s |
| Repetition frequency | 30 kHz | 10 kHz |
| Focus | on (first) metal layer 11 | 2 mm above metal layer 11 |
| Spot diameter | 13 μm | 20 μm |
| Energy/pulse | 0.11 mJ | 0.32 mJ |
| Overall energy density (totaled over the drilling time per hole) | 525 J/cm$^2$ | 84 J/cm$^2$ |

This setting gave a yield of 130 drillings per second in the first operation and a yield of 305 holes per second in the second operation.

A further example with a somewhat modified setting will be explained with a reference to FIGS. 6A to 6C, 7 and 8. As in the previous example, the metal layer also includes copper, although the dielectric layer now includes FR4 reinforced with glass fiber. In order to make the hole as effectively as possible in this case as well, more circuits of the laser beam 4 are employed in operation 1 than would be necessary just to cut through the metal layer 11. In this way, a deep cut is already made into the dielectric layer 12 in the first operation, at least in the edge region (FIG. 6B). In order to have the highest possible laser energy available, the repetition frequency is selected to be lower in this case, namely 20 kHz. The individual pulses therefore overlap less than in the previous example, as can be seen in FIG. 7 by comparison with FIG. 4. However, this is compensated for by the greater number of circuits, so that a smooth edge is nevertheless obtained in the copper. In the second operation, the laser is set to the same repetition frequency of 10 kHz as in the first example. However, just one circuit of the laser beam (in two concentric circles D1 and D2) is sufficient here to ablate the rest of the dielectric that remains. In detail, the values for this example were as follows:

| Condition | Operation 1 | Operation 2 |
| --- | --- | --- |
| Material/thickness | Cu/12 μm | FR4/65–70 μm |
| Number of circle diameters | 1 | 2 |
| Circuits | 7 | 1 |
| Circumferential velocity | 200 m/s | 400 mm/s |
| Repetition frequency | 20 kHz | 10 kHz |
| Focus | on first metal layer 11 | 2 mm above metal layer 11 |
| Spot diameter | 13 μm | 20 μm |
| Energy/pulse | 0.19 mJ | 0.32 mJ |
| Overall energy density | 1036 J/cm$^2$ | 42 J/cm$^2$ |

In this second example, it was possible to achieve a yield of 77 drillings per second in the first operation and a yield of 543 holes per second in the second operation.

Figure 9:
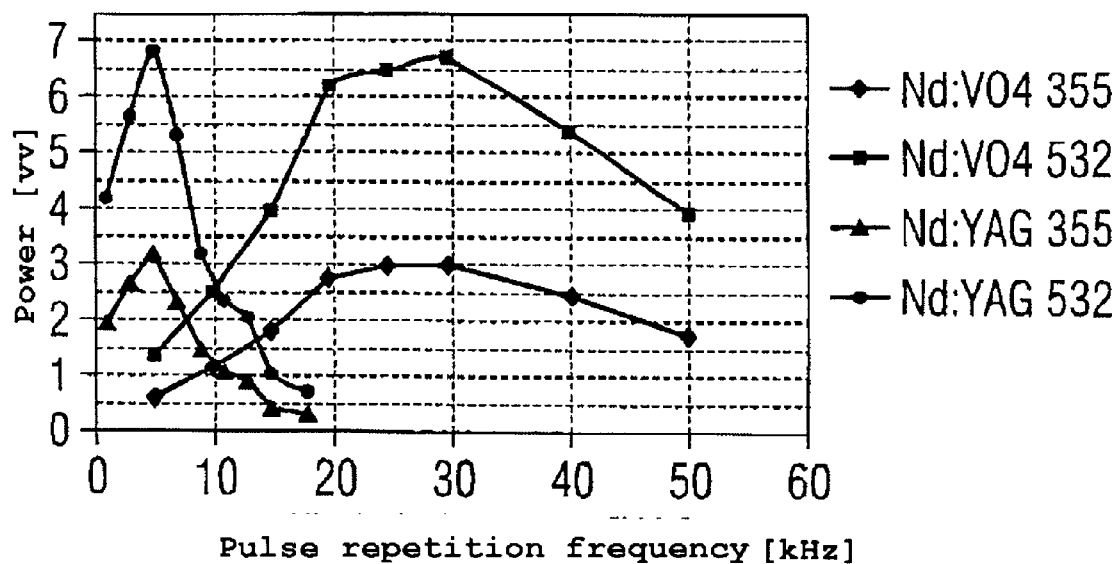
FIG. 9 shows a diagram to represent the average output power of various semiconductor lasers as a function of the repetition frequency.

FIG. 9 contrasts the 355 nm and 532 nm Nd:VO$_4$ lasers with the corresponding Nd:YAG lasers in terms of the power at a given repetition frequency. It is clear to see that the average power of the Nd;VO4 lasers rises significantly above a repetition frequency of 10 kHz, reaching its maximum between 20 and 30 kHz, while the Nd:YAG lasers have their maximum at 5 kHz and then fall off rapidly. This demonstrates that the Nd:VO$_4$ lasers offer significant advantages for the method according to an embodiment of the invention.

Figure 10:
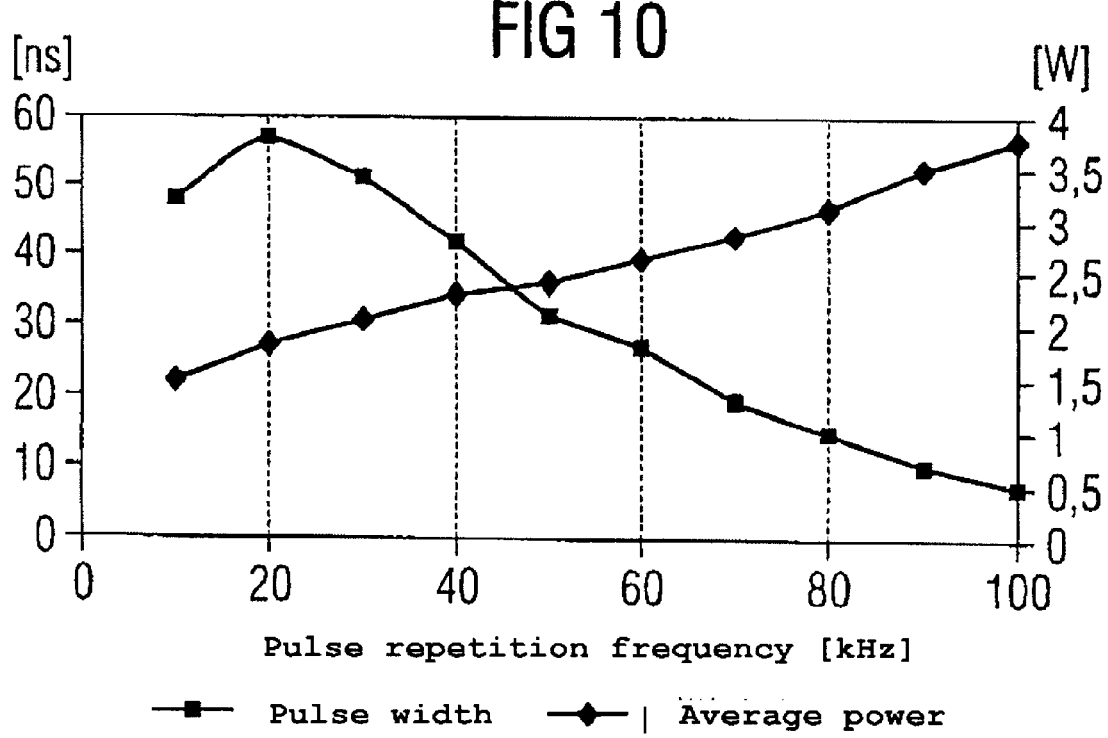
FIG. 10 shows a diagram to represent the average output power and the pulse width of a neodymium vanadate laser having a 355 nm wavelength as a function of the pulse repetition frequency.

FIG. 10 once more shows the profile of the power together with the pulse width as a function of the repetition frequency for an Nd:VO$_4$ laser having a wavelength of 355 nm. It is clear to see that, in the preferably used range of the repetition frequency between 10 and 40 kHz, the average output power of the laser lies in the maximum range, on the one hand, while the pulse width lies below about 35 ns.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for drilling micro-holes in a multi-layer substrate including a first metal layer and at least one second metal layer, and including a dielectric layer arranged between two metal layers, comprising:

irradiating, with an energy beam of a solid-state laser having a repetition frequency of at least 10 kHz, a wavelength of less than 1100 nm and a pulse length of less than 50 ns, the irradiation being carried out in two operations including, ablating, in the first operation, the first metal layer and a part of the underlying dielectric layer, and, ablating, in the second operation, the dielectric layer cleanly down to the second metal layer, wherein, in the first operation, the laser beam is set to a repetition frequency of at least 15 kHz, focused onto the first metal layer and moved with a first circumferential velocity in a circle corresponding to the diameter of the desired hole, in such a number of passes until at least the first metal layer is cut through, the metal layer being fully removed in the hole region, and in the second operation, the laser beam is set to a repetition rate at most equal to that in the first operation, directed out of focus onto the dielectric layer exposed in the hole and moved, with a circumferential velocity which is higher than the first, in at least one concentric circle inside the desired hole diameter, in such a number of passes until the dielectric layer is ablated in the hole region, the defocusing and the second velocity being set such that the effective energy density in the second operation lies below the threshold for ablation of the second metal layer.

2. The method as claimed in claim 1, wherein the laser is a neodymium vanadate laser having a wavelength of 355 nm.

3. The method as claimed in claim 1, wherein the laser is a neodymium vanadate laser having a wavelength of 532 nm.

4. The method as claimed in claim 1, wherein the repetition frequency in the first operation is set between about 15 kHz and about 40 kHz and, in the second operation, between about 10 kHz and 20 kHz, the repetition frequency in the second operation always being at most equal to that in the first operation.

5. The method as claimed in claim 2, wherein the repetition frequency in the first operation is set between about 15 kHz and about 40 kHz and, in the second operation, between about 10 kHz and 20 kHz, the repetition frequency in the second operation always being at most equal to that in the first operation.

6. The method as claimed in claim 1, wherein the repetition frequency is set to 15 kHz in both operations.

7. The method as claimed in claim 1, wherein the circumferential velocity of the laser beam in the first operation is between 200 and 300 mm/s and, in the second operation, between 200 and 600 mm/s.

8. The method of claim 7, wherein the circumferential velocity is set higher in the second operation than in the first operation.

9. The method as claimed in claim 1, wherein the circumferential velocity in the second operation is higher than 600 mm/s.

10. The method of claim 9, wherein the circumferential velocity is set higher in the second operation than in the first operation.

11. The method as claimed in claim 1, wherein, for a desired hole diameter>150 μm, an additional circle of laser pulses is directed in the first operation onto the region inside the circle described by the laser beam.

12. The method as claimed in claim 1, wherein the first operation is firstly performed for all the holes of a processing region, and wherein the laser setting is then modified and the second operation is carried out for all the holes of the region.

13. A method for drilling micro-holes in a multi-layer substrate including a first metal layer and at least one second metal layer, and including a dielectric layer in each case arranged between two metal layers comprising:
  irradiating, with an energy beam of a solid-state laser having a repetition frequency of at least 10 kHz, a wavelength of less than 1100 nm and a pulse length of less than 50 ns, the irradiation being carried out in two operations including,
    ablating in the first operation, the first metal layer and a part of the underlying dielectric layer, and,
    ablating in the second operation, the dielectric layer cleanly down to the second metal layer, wherein, in the first operation, the laser beam is set to a repetition frequency of at least 15 kHz, focused onto the first metal layer and moved with a first circumferential velocity in a circle corresponding to the diameter of the desired hole, in such a number of passes until at least the first metal layer is cut through, the metal layer being fully removed in the hole region, and in the second operation, the laser beam is set to a repetition rate at most equal to that in the first operation, and centrally directed onto the dielectric layer exposed in the hole, the beam being defocused in such a way that the spot irradiated by it is at least as large as the area of the hole to be drilled, such that the hole cut out of the metal layer in the first operation acts as a mask.

14. The method as claimed in claim 13, wherein the laser is a neodymium vanadate laser having a wavelength of 532 nm.

15. The method as claimed in claim 13, wherein the repetition frequency in the first operation is set between about 15 kHz and about 40 kHz and, in the second operation, between about 10 kHz and 20 kHz, the repetition frequency in the second operation always being at most equal to that in the first operation.

16. The method as claimed in claim 13, wherein the repetition frequency is set to 15 kHz in both operations.

17. The method as claimed in claim 14, wherein the repetition frequency in the first operation is set between about 15 kHz and about 40 kHz and, in the second operation, between about 10 kHz and 20 kHz, the repetition frequency in the second operation always being at most equal to that in the first operation.

18. The method as claimed in claim 14, wherein the repetition frequency is set to 15 kHz in both operations.

\* \* \* \* \*